(12) United States Patent
Reboh

(10) Patent No.: US 11,062,951 B2
(45) Date of Patent: Jul. 13, 2021

(54) METHOD OF MANUFACTURING OF A FIELD EFFECT TRANSISTOR HAVING A JUNCTION ALIGNED WITH SPACERS

(71) Applicant: Commissariat A L'Energie Atomique et aux Energies Alternatives, Paris (FR)

(72) Inventor: Shay Reboh, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 61 days.

(21) Appl. No.: 16/681,912

(22) Filed: Nov. 13, 2019

(65) Prior Publication Data

US 2020/0161186 A1    May 21, 2020

(30) Foreign Application Priority Data

Nov. 14, 2018 (FR) ...................................... 18 71512

(51) Int. Cl.
*H01L 21/8234* (2006.01)
*H01L 29/66* (2006.01)
*H01L 21/02* (2006.01)

(52) U.S. Cl.
CPC ............. *H01L 21/823412* (2013.01); *H01L 21/02532* (2013.01); *H01L 21/823437* (2013.01)

(58) Field of Classification Search
CPC ....... H01L 21/823412; H01L 21/02532; H01L 21/823437; H01L 29/66545; H01L 29/1054
See application file for complete search history.

(56) References Cited

U.S. PATENT DOCUMENTS

| 7,687,356 B2* | 3/2010 | Coronel | H01L 29/78684 438/285 |
| 9,040,391 B2* | 5/2015 | Damlencourt | H01L 29/78 438/478 |
| 9,406,529 B1* | 8/2016 | Chan | H01L 29/7851 |

(Continued)

FOREIGN PATENT DOCUMENTS

| EP | 2 075 826 A2 | 7/2009 |
| EP | 2 075 826 A3 | 7/2009 |

OTHER PUBLICATIONS

French Preliminary Search Report dated Jul. 8, 2019 in French Application 18 71512 filed on Nov. 14, 2018 (with English Translation of Categories of Cited Documents & Written Opinion).

*Primary Examiner* — Earl N Taylor
(74) *Attorney, Agent, or Firm* — Oblon, McClelland, Maier & Neustadt, L.L.P.

(57) ABSTRACT

A process for fabricating a field-effect transistor includes providing a structure including a first silicon layer and a second layer, made of SiGe alloy, covering the first silicon layer. The method further includes forming a sacrificial gate covered with a hardmask on top of the second layer made of SiGe alloy and etching the second layer made of SiGe alloy, following the pattern of the hardmask in order to delimit an element made of SiGe alloy in the second layer. The method also includes forming spacers on top of the first silicon layer on either side of the sacrificial gate and of the element, removing the sacrificial gate, and enriching the first layer arranged beneath the element in germanium using a germanium condensation process.

10 Claims, 16 Drawing Sheets

(56) References Cited

U.S. PATENT DOCUMENTS

| | | | | |
|---|---|---|---|---|
| 10,147,820 B1* | 12/2018 | Ando | ................ | H01L 29/66795 |
| 10,510,872 B2* | 12/2019 | Xu | ...................... | H01L 29/7851 |
| 10,686,076 B2* | 6/2020 | Ando | ................ | H01L 29/1054 |
| 2005/0245092 A1* | 11/2005 | Orlowski | .......... | H01L 21/02164 |
| | | | | 438/758 |
| 2007/0082453 A1* | 4/2007 | Orlowski | .......... | H01L 21/02164 |
| | | | | 438/395 |
| 2009/0170295 A1* | 7/2009 | Vincent | ............ | H01L 21/32105 |
| | | | | 438/507 |
| 2017/0018630 A1* | 1/2017 | He | ................... | H01L 29/66795 |
| 2017/0047406 A1* | 2/2017 | He | ...................... | H01L 29/4966 |
| 2017/0194481 A1* | 7/2017 | He | ................... | H01L 21/31116 |
| 2018/0175166 A1* | 6/2018 | Reboh | ............. | H01L 29/42392 |
| 2018/0301534 A1* | 10/2018 | He | ................... | H01L 21/02532 |
| 2019/0378764 A1* | 12/2019 | Cheng | ............... | H01L 29/41791 |
| 2020/0161186 A1* | 5/2020 | Reboh | ............. | H01L 21/02532 |

* cited by examiner

[Fig. 1]
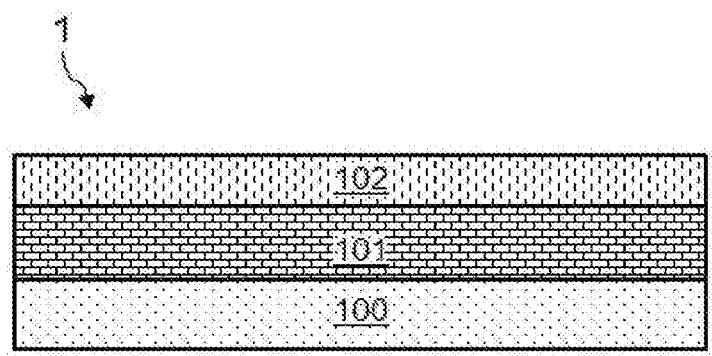
[Fig. 2]
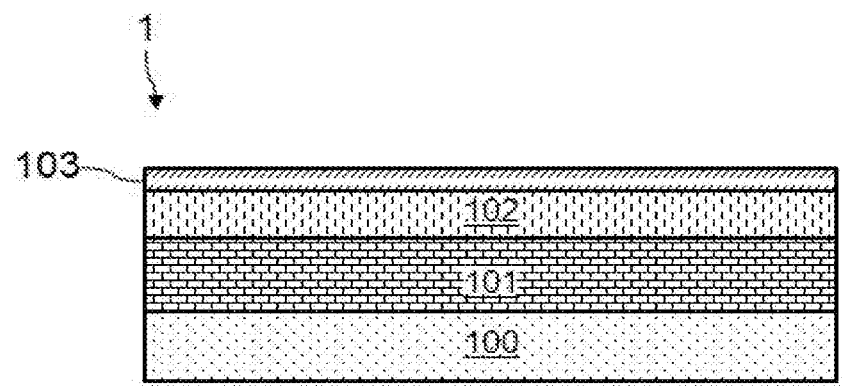
[Fig. 3]
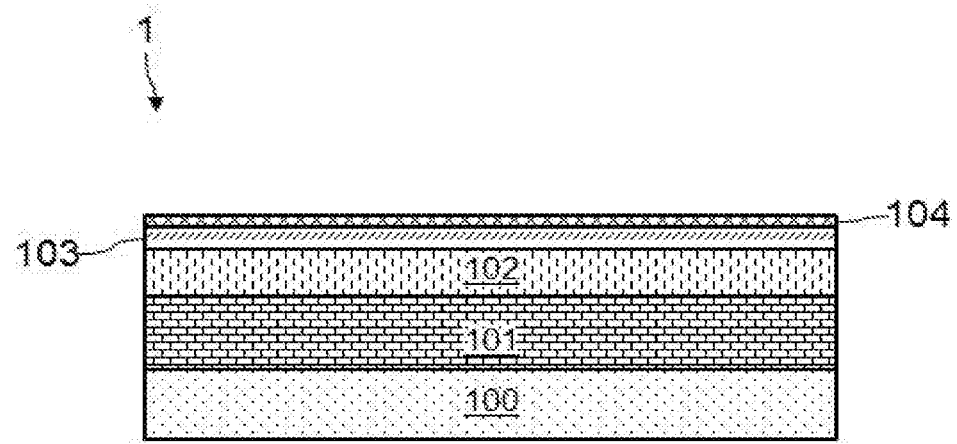

[Fig. 4]
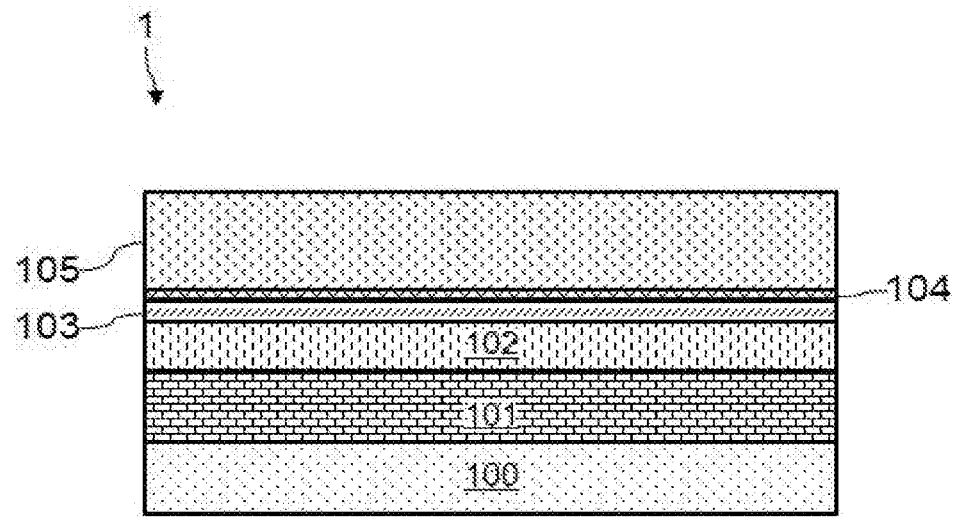
[Fig. 5]
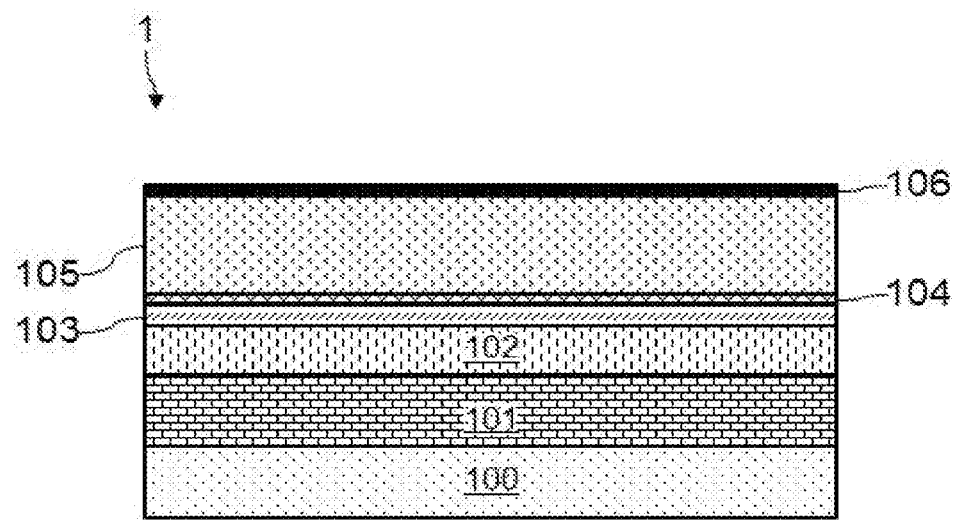

[Fig. 6]
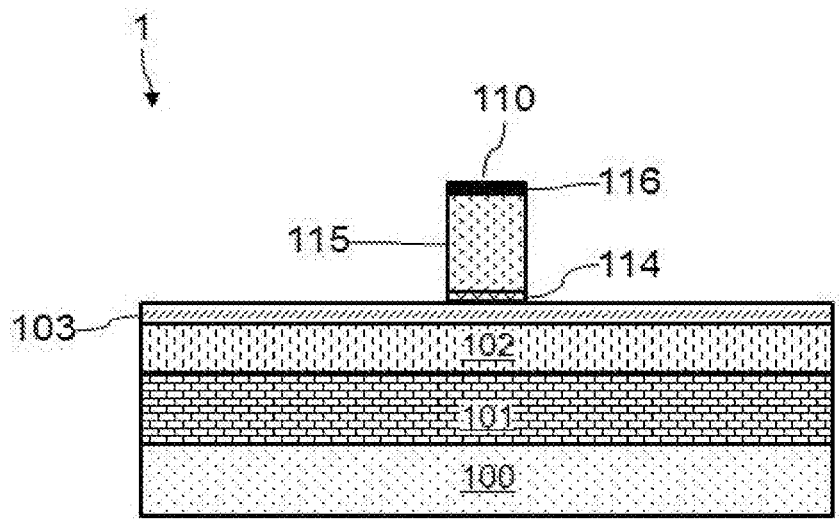
[Fig. 7]
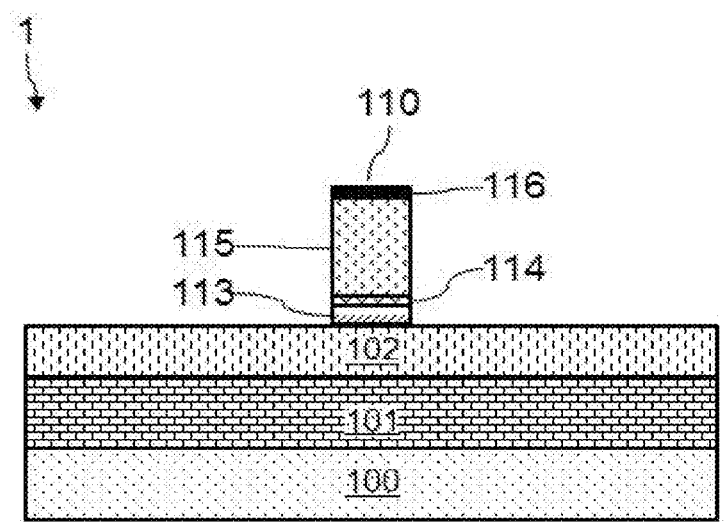

[Fig. 8]
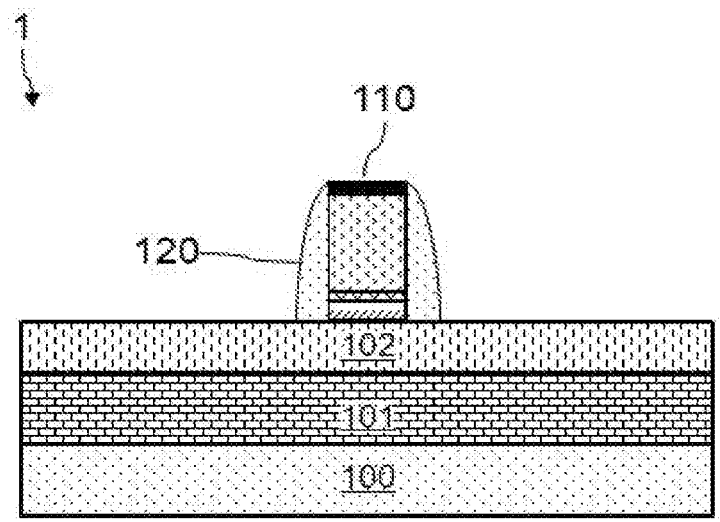
[Fig. 9]
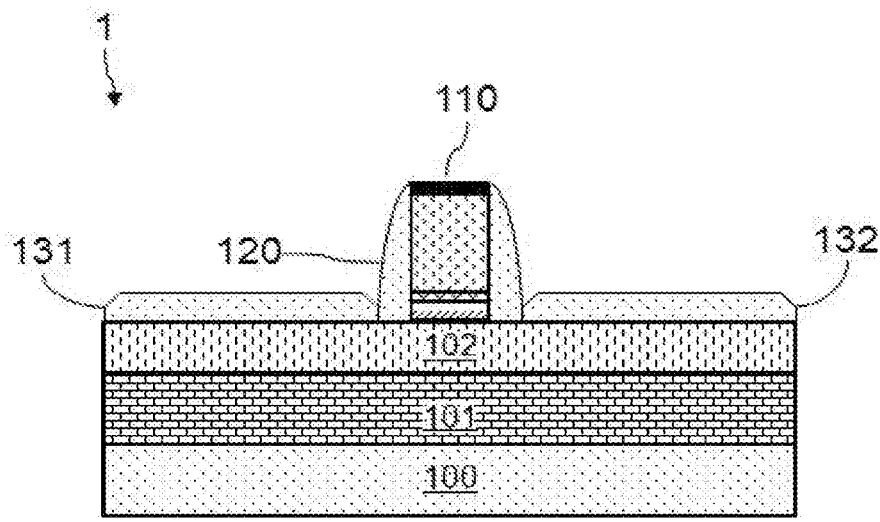

[Fig. 10]
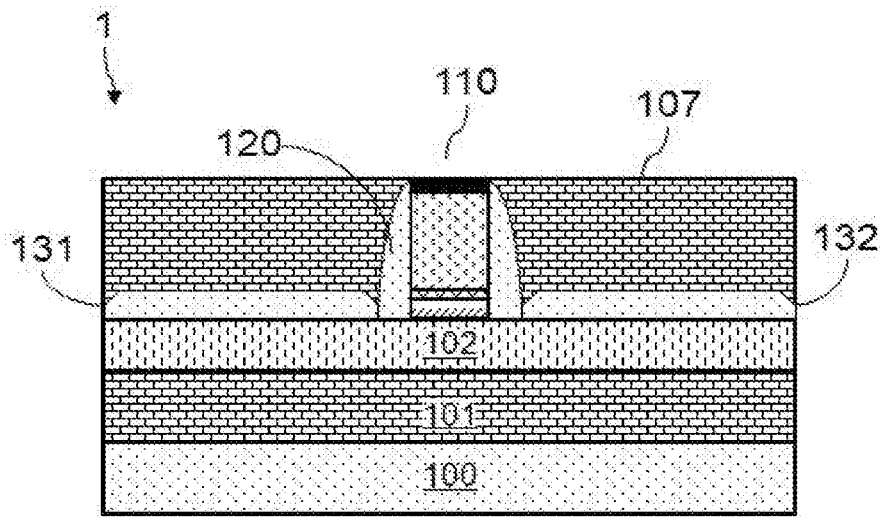
[Fig. 11]
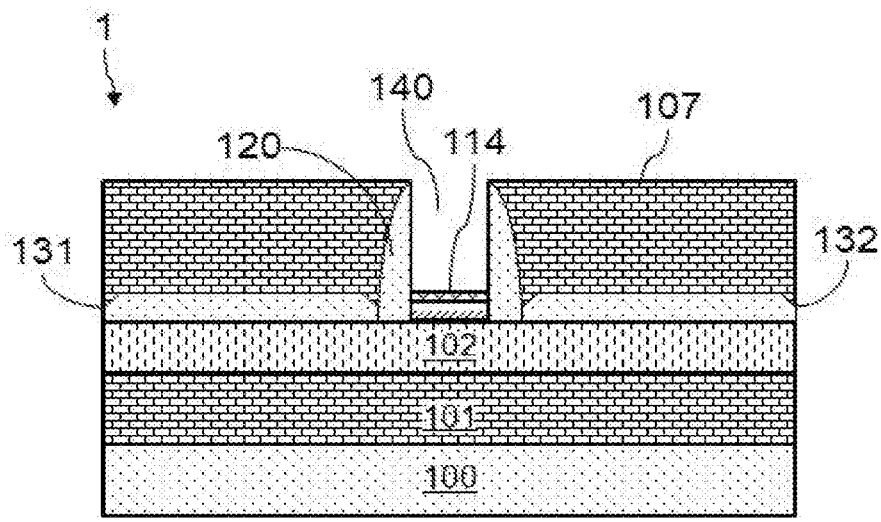

[Fig. 12]
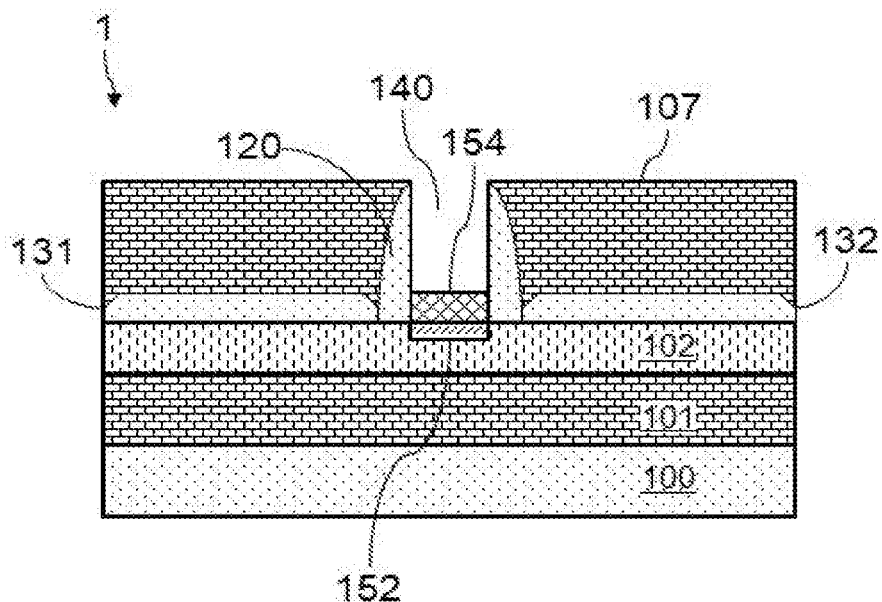
[Fig. 13]
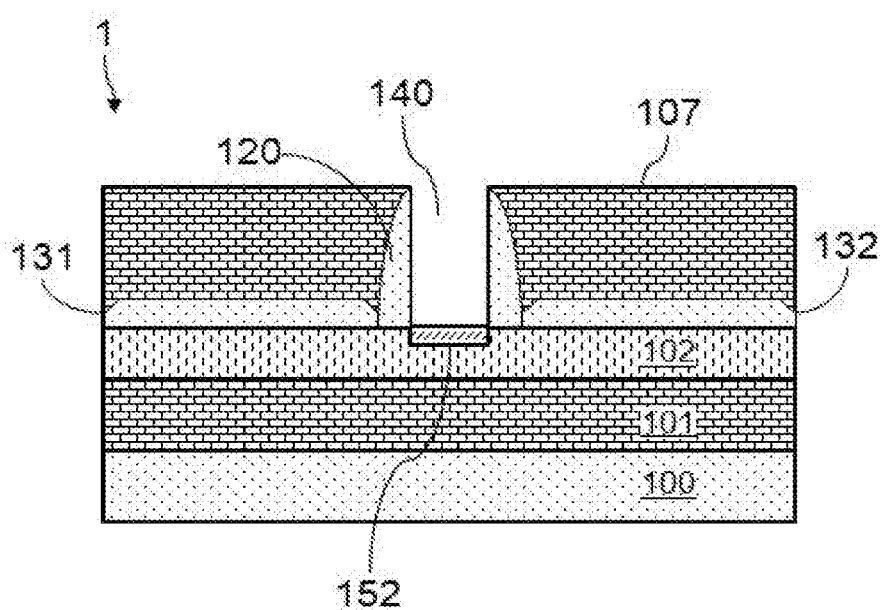

[Fig. 14]
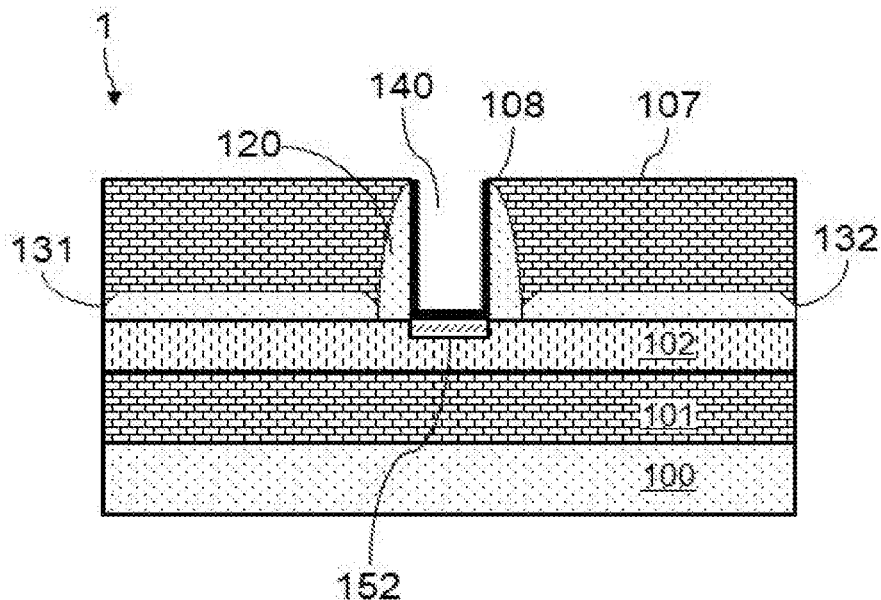
[Fig. 15]
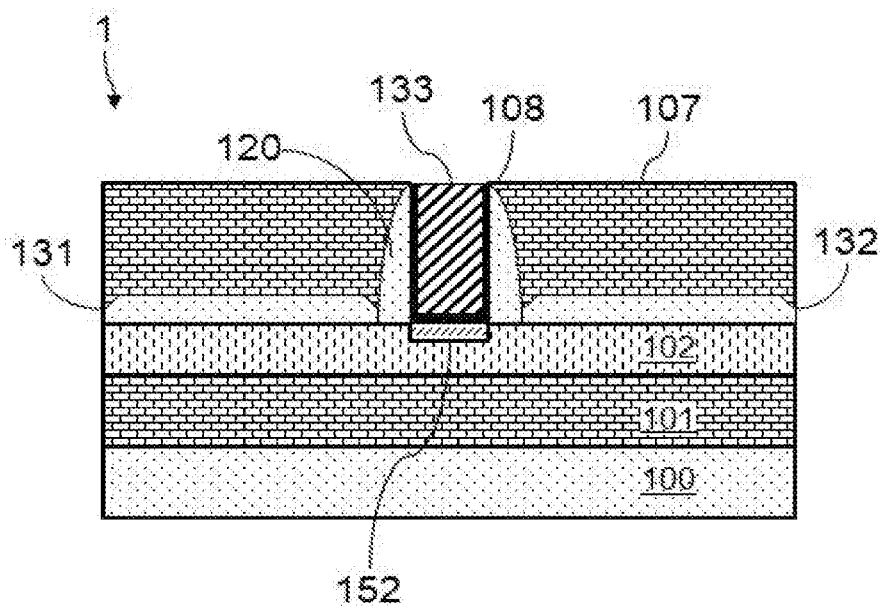

[Fig. 16]
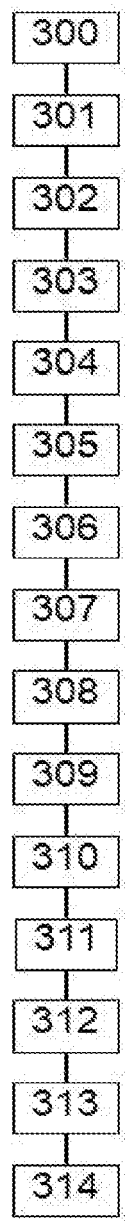

[Fig. 17]
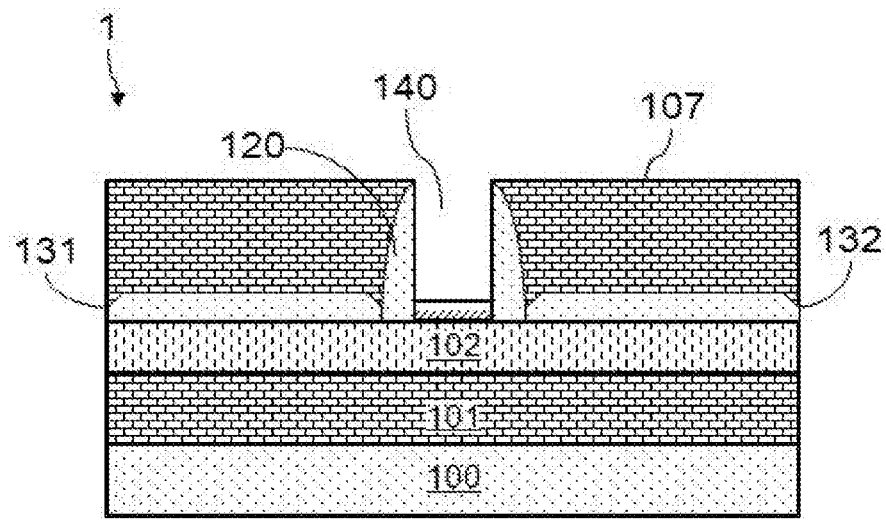
[Fig. 18]
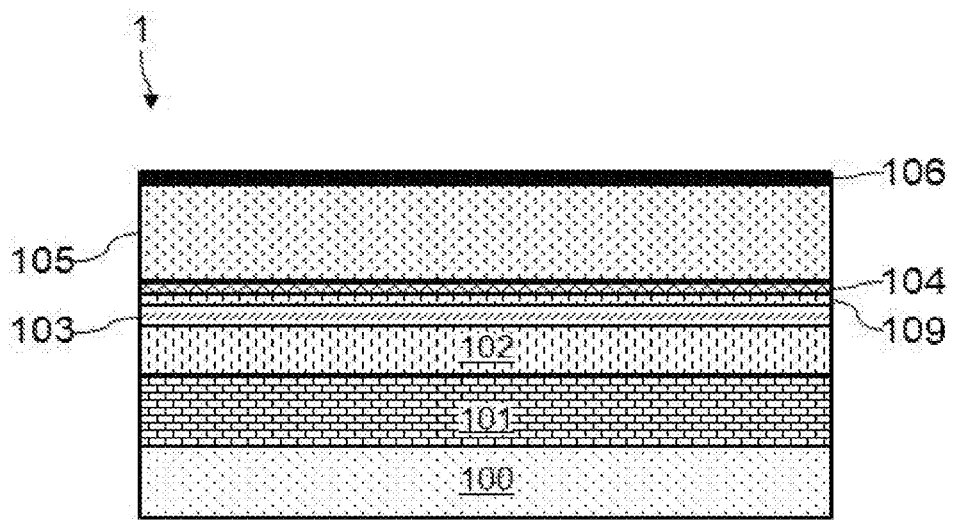

[Fig. 19]
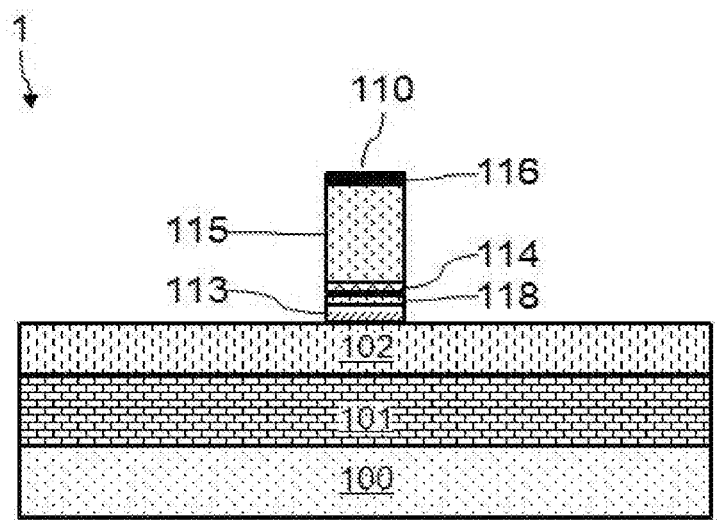
[Fig. 20]
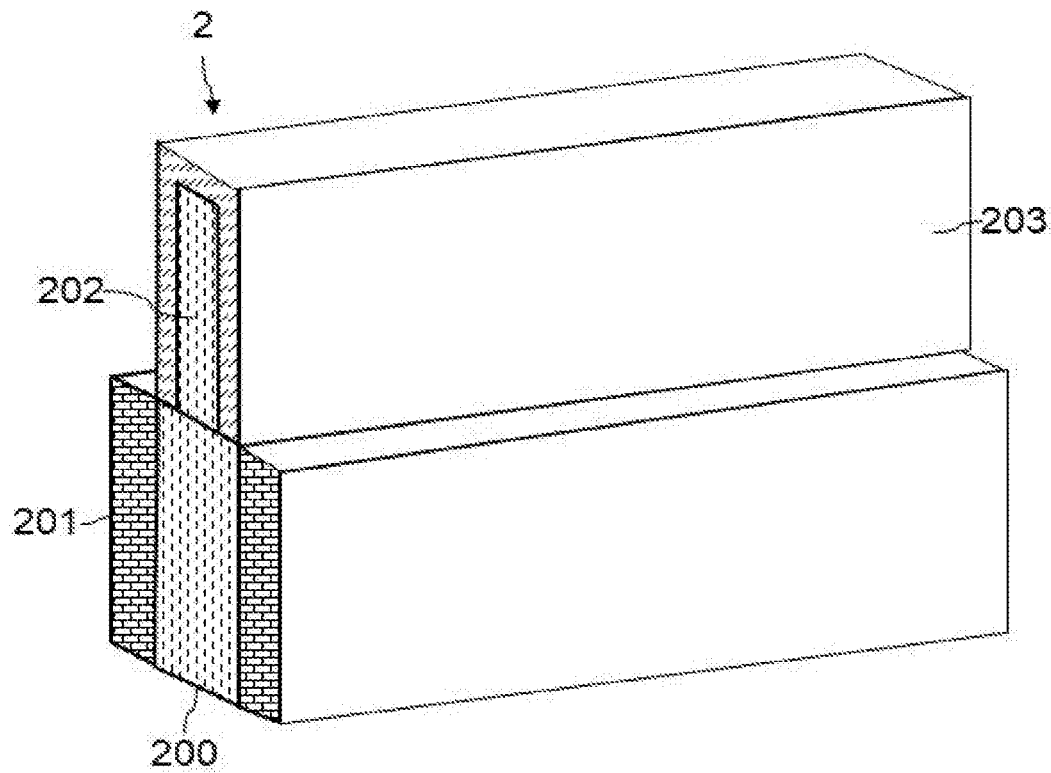

[Fig. 21]
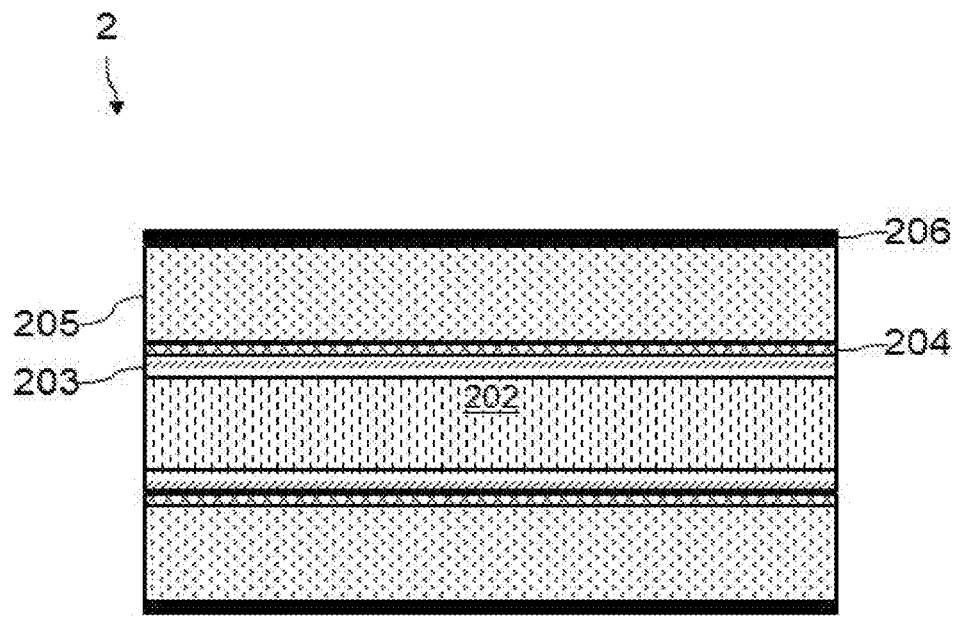
[Fig. 22]
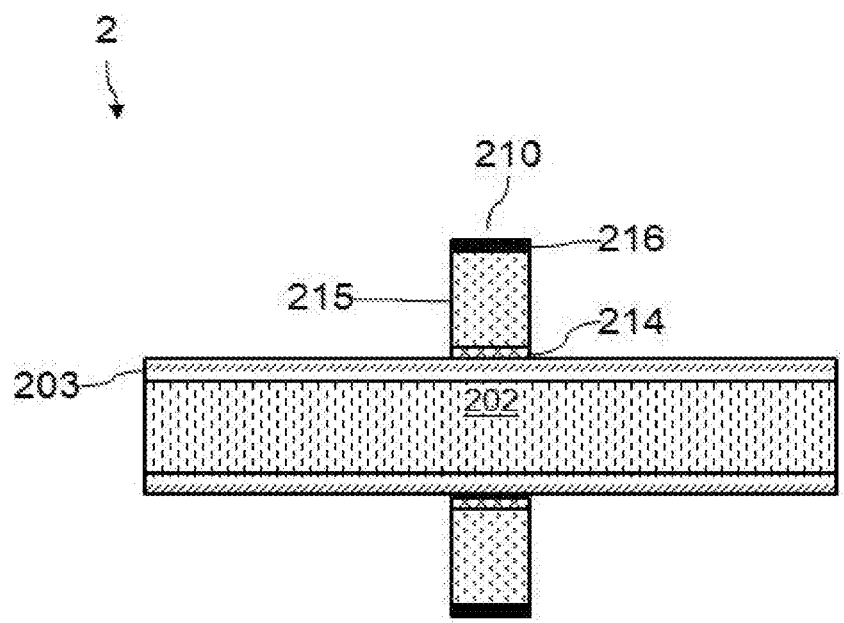

[Fig. 23]
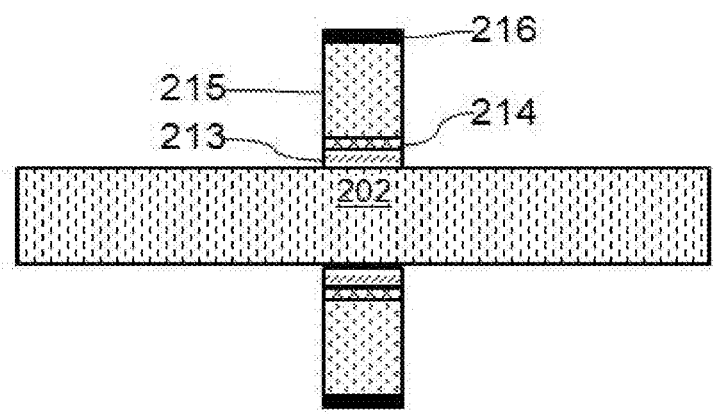
[Fig. 24]
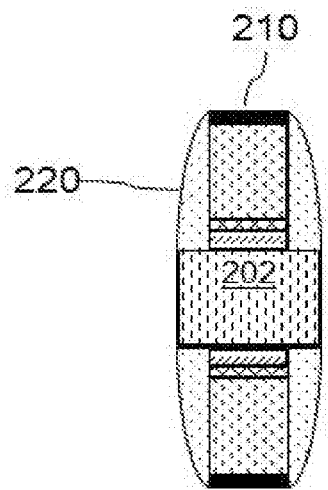

[Fig. 25]
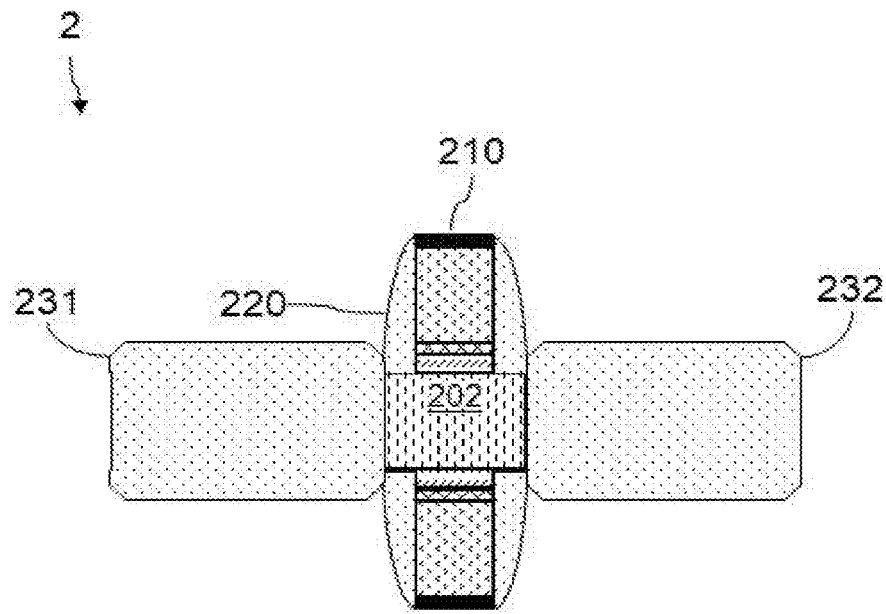
[Fig. 26]
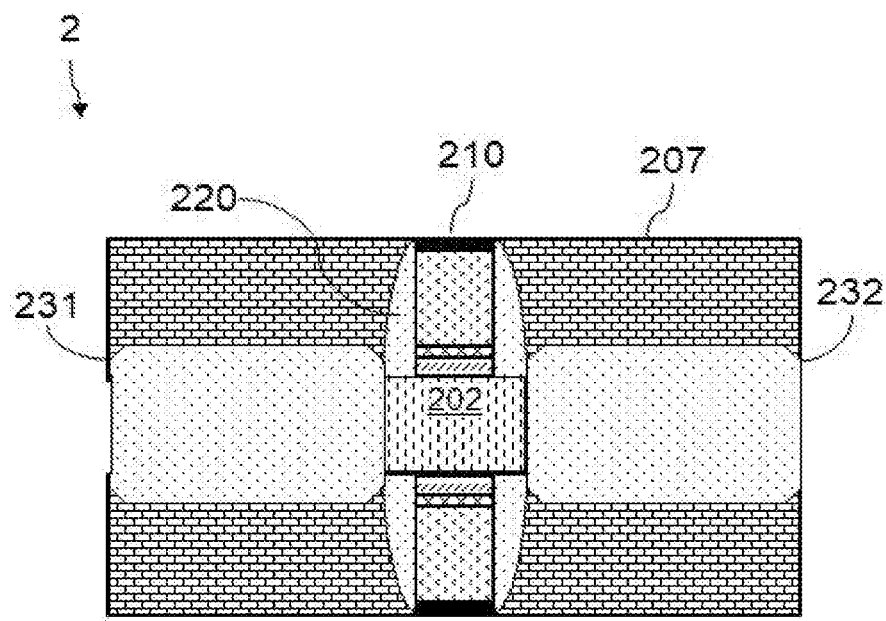

[Fig. 27]
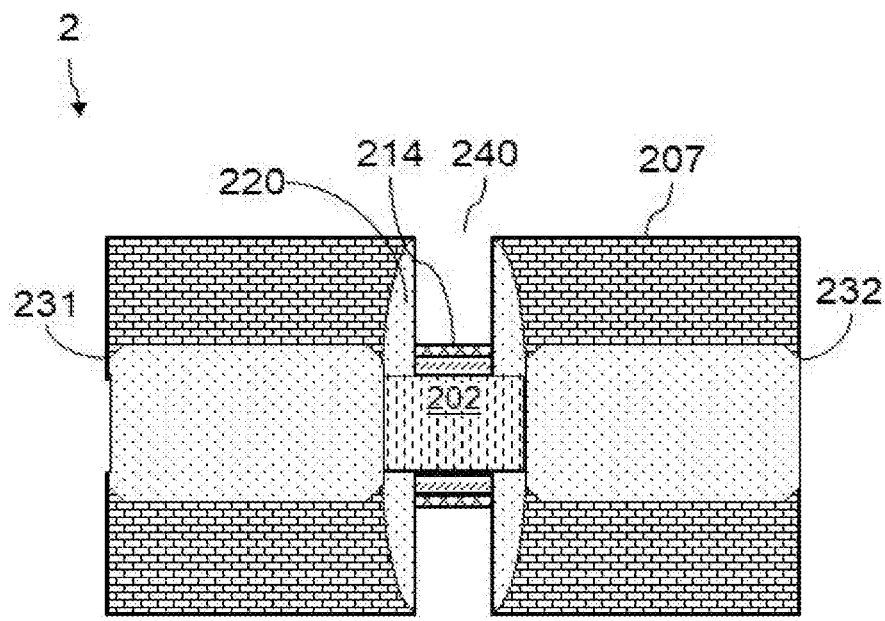
[Fig. 28]
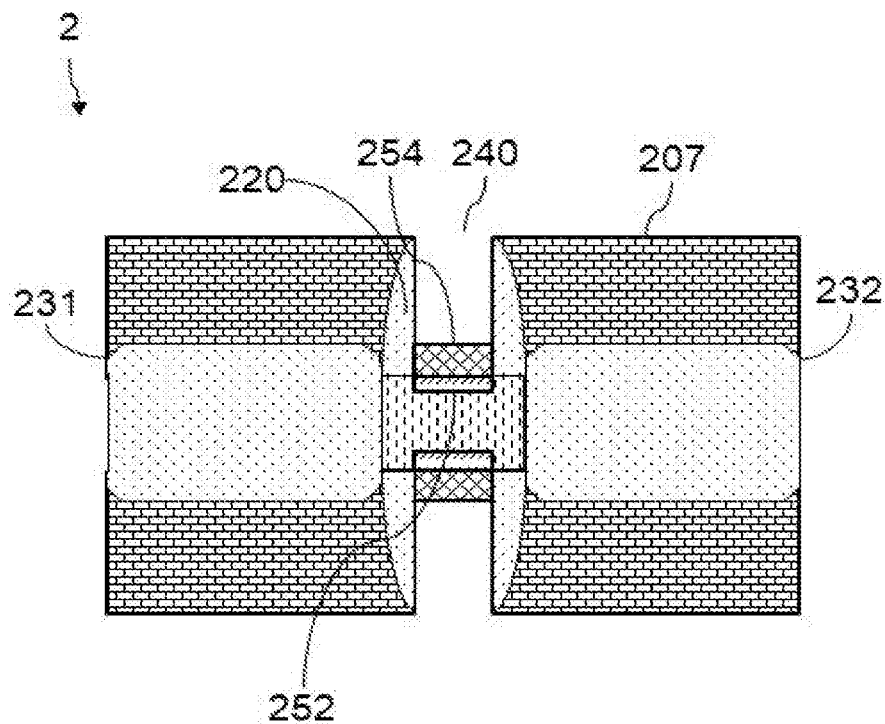

[Fig. 29]
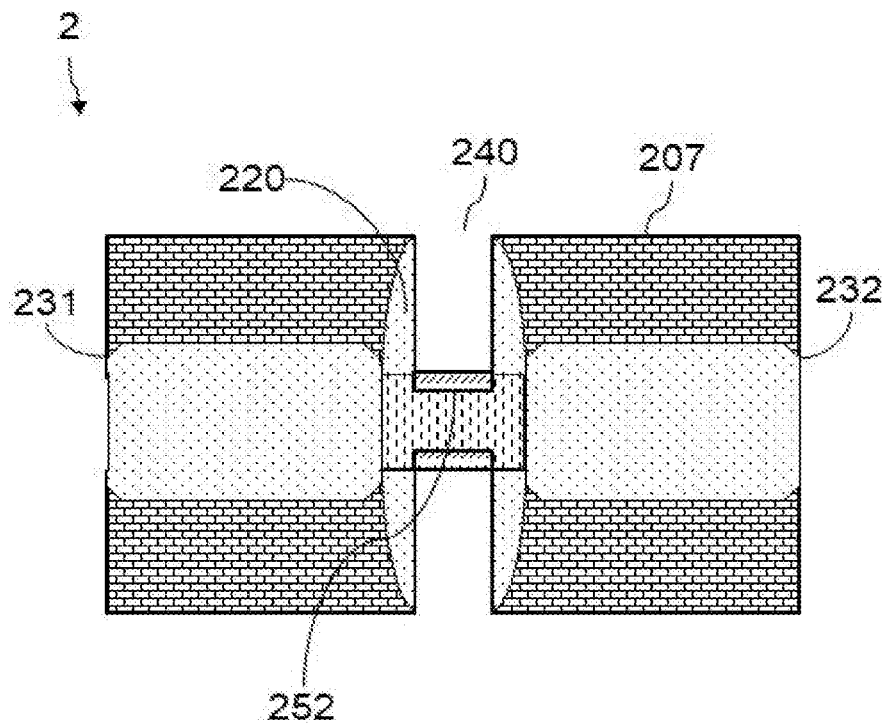
[Fig. 30]
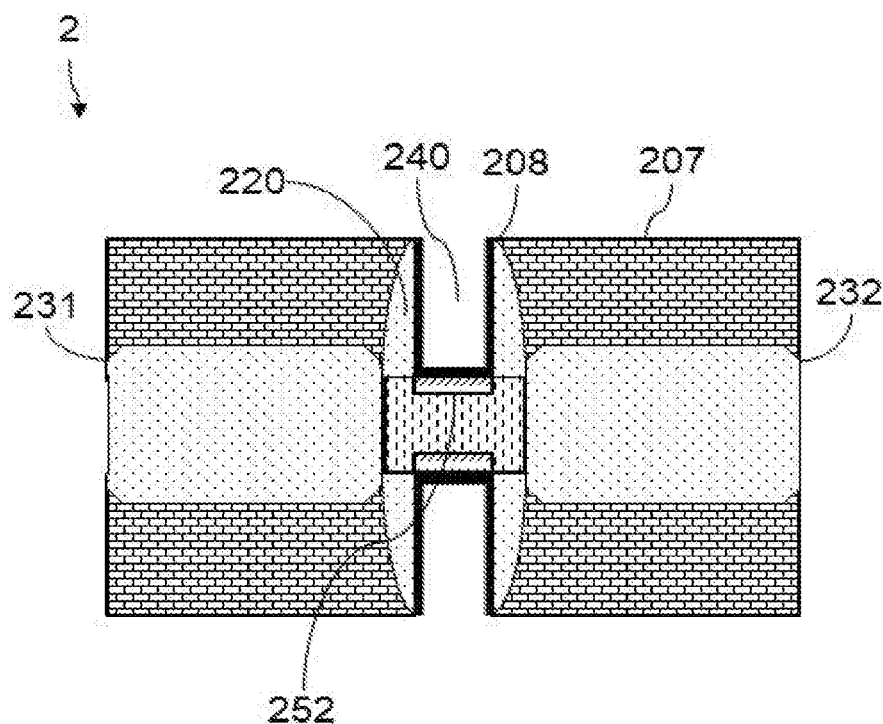

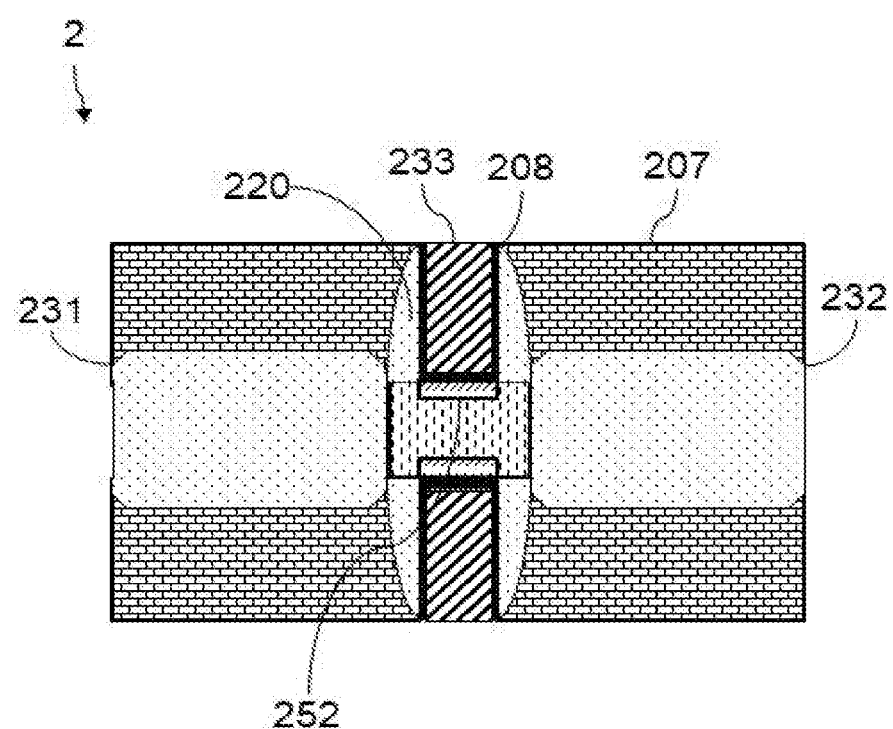
[Fig. 31]

METHOD OF MANUFACTURING OF A FIELD EFFECT TRANSISTOR HAVING A JUNCTION ALIGNED WITH SPACERS

The invention relates to field-effect transistors, and in particular to processes for fabricating such transistors aiming to increase the mobility of electrons in their channel by generating strain therein.

With the decrease in the size of technological nodes, new technologies have been envisaged for improving the performance of CMOS transistors. Thus, it has been observed that applying strain to the channel of such transistors allows the performance thereof to be influenced. Tensile strain in the channel makes it possible in particular to increase electron mobility while compressive strain in the channel improves hole mobility. Thus, the formation of tensilely strained silicon channels for nMOS transistors and compressively strained SiGe channels for pMOS transistors has been proposed.

Various fabrication processes have been envisaged for controlling the local mechanical strain in the channel of the transistors. In particular, for pMOS transistors produced on an FDSOI substrate, the silicon layer present on the insulator is covered with SiGe in the zones that are intended to form pMOS transistors. A process of condensation of the germanium into the silicon layer by thermal oxidation is next implemented. A thermal-oxidation operation is implemented, resulting in the formation of a layer of $SiO_2$ in the upper portion and diffusing the germanium into the silicon layer to transform it into a layer of SiGe. With the insulating layer forming a barrier, the layer of SiGe exhibits a relatively uniform germanium concentration. Such a layer of SiGe generally retains the lattice parameters of the original silicon layer. The diffusion of germanium into this silicon layer results in it being biaxially compressively strained in a plane parallel to the insulating layer.

A known process for forming the SiGe channel of a pMOS transistor is the following. Starting from a substrate including an insulating layer surmounted by a silicon layer, a layer of SiGe is deposited on top of the silicon layer in the zone where pMOS transistors are to be formed. A sacrificial gate stack is next formed on the layer of SiGe and spacers are formed on either side of the sacrificial gate stack. A raised source and drain are deposited by epitaxy of silicon on top of the layer of SiGe, on either side of the assembly including the gate stack and the spacers. The raised source and drain are next covered with a protective layer. The sacrificial gate stack is removed to form a groove and to expose the layer of SiGe at the bottom of this groove.

Next, a condensation step is implemented to diffuse germanium from the layer of SiGe into the layer of silicon at the bottom of the groove, and to form a layer of $SiO_2$ in the upper portion. A lower layer of SiGe is thus formed on top of the insulating layer at the bottom of the groove. The layer of $SiO_2$ is subsequently removed from the bottom of the groove. A gate stack is then formed in the groove.

The structure thus obtained has some drawbacks. The condensation process at the bottom of the groove continues laterally beneath the spacers. Both $SiO_2$ and SiGe are formed beneath the spacers. Such a process may thus negatively affect the properties of the transistor formed.

According to another known process, starting from a substrate including an insulating layer surmounted by a silicon layer, a layer of SiGe is deposited on top of the silicon layer in the zone where pMOS transistors are to be formed. Next, a condensation step is implemented in order to diffuse germanium from the layer of SiGe into the layer of silicon. The $SiO_2$ formed at the surface is removed in order to provide access to the layer of SiGe formed in the condensation process. Grooves are then etched between the zone intended for the nMOS transistors and the zone intended for the pMOS transistors. Next, the grooves are filled with insulating material to form trench isolations, which are generally referred to as STIs. Gate stacks and raised sources and drains are then formed on top of the layer of SiGe. It has been possible to observe relaxation effects in the layer of SiGe in proximity to the trench isolations. The transistors thus formed in proximity to the trench isolations exhibited decreased performance levels due to an excessive decrease in compressive strain in their SiGe channel, despite strain models suggesting a small drop in compressive strain.

The invention aims to overcome one or more of these drawbacks. Thus, the invention relates to a process for fabricating a field-effect transistor such as defined in the appended claims.

The invention also relates to the variants of the dependent claims. A person skilled in the art will understand that each of the features in the description or in the dependent claims may be independently combined with the features of an independent claim without, however, constituting an intermediate generalization.

Other features and advantages of the invention will become clearly apparent from the description thereof that is given hereinafter, by way of indication and without any limitation, with reference to the appended drawings, in which:

FIG. 1, FIG. 2, FIG. 3, FIG. 4, FIG. 5, FIG. 6, FIG. 7, FIG. 8, FIG. 9, FIG. 10, FIG. 11, FIG. 12, FIG. 13, FIG. 14, and FIG. 15 are sectional views of a field-effect transistor at various steps in its fabrication process according to a first embodiment;

FIG. 16 is a diagram illustrating the steps in the fabrication process according to the first embodiment;

FIG. 17 illustrates a step in a variant of a fabrication process according to the first embodiment;

FIG. 18 and FIG. 19 are sectional views of a field-effect transistor at various steps in another variant of a fabrication process according to the first embodiment;

FIG. 19 is a perspective view of a field-effect transistor at a step in a fabrication process according to a second embodiment;

FIG. 21, FIG. 22. FIG. 23, FIG. 24, FIG. 25, FIG. 26, FIG. 27, FIG. 28, FIG. 29, FIG. 30, and FIG. 31 are sectional views of a field-effect transistor at various steps in its fabrication process according to a second embodiment.

The invention may be implemented from step 305, starting from the configuration illustrated in FIG. 5. However, examples of prior steps with a view to obtaining the configuration illustrated in FIG. 5 will be described.

In step 300, a substrate with a layer of silicon 102, for example silicon that is not intentionally doped, is provided. The thickness of the layer of silicon 102 is typically between 5 and 20 nm, for example 6 nm. The layer of silicon 102 is here formed on top of a buried insulating layer 101, for example made of $SiO_2$, the thickness of which is typically between 15 and 40 nm, for example 25 nm. The buried insulating layer 101 is formed on top of a substrate 100, typically made of silicon that is not intentionally doped. The invention may however also be applied with a layer of silicon 102 belonging to a bulk substrate. The process may move on to a preliminarily step of masking the zones for the formation of nMOS transistors so as to make only the zones for the formation of pMOS transistors accessible.

In step 301, a layer 103 made of SiGe alloy is formed on top of the layer of silicon 102, as illustrated in FIG. 2. The layer 103 is typically deposited by epitaxial growth. The thickness of the layer 103 is typically between 10 and 20 nm. The germanium concentration of the layer 103 is for example between 15% and 60% (in terms of number of atoms). The operation of deposition by epitaxial growth is for example carried out using SiGe with 30% germanium at a temperature of 630° C., using $H_2$ as the carrier gas, and germane ($GeH_4$) and dichlorosilane (DCS, $SiH_2Cl_2$) as precursors. The operation of deposition by epitaxial growth may also be carried out using SiGe with 10% germanium at a temperature of 700° C., using $H_2$ as the carrier gas, and germane ($GeH_4$) and silane ($SiH_4$) as precursors. Advantageously, the layer 103 is pseudomorphic, i.e. its thickness is less than its critical thickness for relaxation, from which it begins to undergo plastic relaxation.

The operation of forming the layer of SiGe may be preceded by an operation of preparing the surface by means of in-situ dry cleaning, referred to as Siconi in the publication Journal of Vacuum Science & Technology B 28, 56 (2010).

In steps 302 to 305, steps of fabricating a sacrificial gate are implemented.

In step 302, a protective layer 104 is formed on top of the layer of SiGe 103, as illustrated in FIG. 3. The layer 104 is typically made of $SiO_2$. The thickness of this layer 104 is typically between 1 and 10 nm.

In step 303, a layer 105 made of amorphous silicon is formed on top of the protective layer 104, as illustrated in FIG. 4.

In step 304, a hardmask layer 106 is formed on top of the layer of amorphous silicon 105, as illustrated in FIG. 5. The hardmask layer 106 is for example formed of SiN.

In step 305, a lithography step is carried out. Next, a step of anisotropically etching the layer 106, 105 and the layer 104 (and possibly the layer 103 instead of step 306 described below) following the etch mask 116 is carried out in order to form the sacrificial gate stack 110. The etch is here stopped at the layer 103 in order to obtain the configuration illustrated in FIG. 6.

In step 306, a step of advantageously anisotropically etching the layer 103 following the pattern of the mask 106 is implemented in order to obtain the element 113 made of SiGe beneath the sacrificial gate stack 110. The etch is stopped at the layer 102 on either side of the gate stack in order to obtain the configuration illustrated in FIG. 7. The width of the sacrificial gate stack 110 formed may for example be between 10 and 100 nm (this width corresponds to the gate length).

In step 307, spacers 120 are formed on either side of the sacrificial gate stack 110, of the hardmask 116 and of the element 113 made of SiGe in order to obtain the configuration illustrated in FIG. 8. The formation of the spacers 120 may be implemented by conformal deposition of SiN, then by anisotropically etching this layer of SiN until the layer 102 is exposed. The width of the spacers 120 formed may for example be between 5 and 10 nm.

In step 308, a raised source 131 and drain 132 are formed on top of the layer 102, on either side of the assembly including the spacers 120 and the sacrificial gate stack 110, in order to obtain the configuration illustrated in FIG. 9. The source 131 and the drain 132 are typically formed by epitaxial deposition of a silicon alloy on top of the layer 102, which is typically doped appropriately.

In step 309, a protective layer 107 is formed on top of the source 131 and the drain 132, on either side of the assembly including the spacers 120 and the sacrificial gate stack 110, in order to obtain the configuration illustrated in FIG. 10. The operation of forming the protective layer 107 typically comprises an operation of depositing dielectric, typically based on $SiO_2$, followed by a chemical-mechanical-polishing operation that stops at the hardmask 116.

In step 310, the hardmask 116 and the element 115 are removed to form a groove 140 between the spacers 120 in order to obtain the configuration illustrated in FIG. 11. This removal operation is for example implemented by means of a selective-etching operation that stops at the element 114. The element 114 then forms the bottom of the groove 140. It is also possible to envisage removing the element 114 and stopping the etch at the element 113 (which example is illustrated with reference to FIG. 17). If the element 114 is removed, a cleaning step, for example using HF-SPM-SCI-HCl, is advantageously implemented, resulting in the formation of a chemical oxide of around 1 nm in thickness on top of the element 113. Retaining an oxide on top of the element 113 before initiating step 311 will allow this element 113 to be protected without the condensation process being negatively affected.

In step 311, a step of condensation of germanium into the layer 102, via thermal oxidation of the element 103, is implemented in order to form a channel 152 made of SiGe in the layer 102. The germanium condensation process includes the diffusion of germanium from the element made of SiGe 103 into the layer 102. A thermal oxide 154 is also formed on top of the channel 152 during the condensation process. Additionally, as illustrated in the configuration obtained in FIG. 12, the obtained channel 152 made of SiGe is aligned with the inner faces of the spacers 120. Moreover, because the element 113 is located to the side of the spacers 120 and not underneath them, the formation of a thermal oxide beneath the spacers 120 is avoided, which oxide would have to be removed with the formation of undesirable voids beneath these spacers 120.

The condensation of germanium by thermal oxidation may for example be implemented at a temperature of 1100° C. The duration of the condensation process depends on the thickness of the element 113 and on its germanium concentration. For example, for an element 113 with 25% Ge and a thickness of 8.5 nm, on top of a layer 102 with a thickness of 11 nm on top of an insulating layer 101, a duration of between 45 and 50 s has proven to be suitable. What is thus obtained is a channel 152 extending down to the layer 101, with a germanium concentration that varies linearly from 5% at the interface with the layer 101 to 27% at the interface with the thermal oxide.

It is also possible to envisage carrying out the germanium condensation operation at a temperature of just 750° C. for a duration of about 8 h.

To decrease the thermal budget (product of time and temperature for a step) of the condensation step, it is also possible to condense only some of the thickness of the layer 102, some silicon being retained between the channel 152 made of SiGe and the layer 101. It is not essential for the entire thickness of the layer 102 to be enriched. Since the majority of conduction occurs at the surface of the channel 152, enriching the layer 102 to form a channel with a thickness of between 3 and 6 nm may prove to be sufficient. The enrichment of the channel 152 may also result in a germanium concentration gradient through the thickness of the channel 152.

In step 313, the process moves on to forming a gate insulator 108 on the lateral faces and at the bottom of the groove 140 in order to obtain the configuration illustrated in FIG. 14.

In step 314, the process moves on to forming a gate electrode 133 in the groove 140 and over the gate insulator 108 in order to obtain the configuration illustrated in FIG. 15. The gate metal could for example be W.

FIGS. 18 and 19 illustrate steps in a variant of the fabrication process according to the first embodiment. According to this variant, in the configuration illustrated in FIG. 3, a step of depositing a layer of silicon 109 on top of the layer 103 is implemented, before moving on to the deposition of the layer 104. The steps described with reference to FIGS. 6 to 15, including a step of etching the layer 109 following the pattern of the hardmask 116, may next be implemented in order to form an element made of silicon 118 beneath the sacrificial gate stack 110. The configuration illustrated in FIG. 19 may then be obtained. An element 118 made of silicon alloy is thus formed on top of the element 113.

FIG. 20 is a perspective view of a field-effect transistor 2 at a step in a fabrication process according to a second embodiment. A finFET transistor typically has a gate facing three sides of a channel in the form of a nanowire.

A structure with a silicon substrate (not illustrated) is first provided. A silicon nanowire 200 is formed within the substrate. Dielectric walls 201 are formed on either side of the silicon nanowire 200. A silicon nanowire 202 is formed on top of the nanowire 200. This nanowire 202 is encapsulated within a layer of SiGe 203.

The layer 203 is typically deposited by epitaxial growth from the nanowire 202. The thickness of the layer 203 is typically between 10 and 20 nm. The germanium concentration of the layer 203 is for example between 15% and 60% (in terms of number of atoms). The operation of deposition by epitaxial growth is for example carried out using SiGe with 30% germanium at a temperature of 630° C., using $H_2$ as the carrier gas, and germane ($GeH_4$) and dichlorosilane (DCS, $SiH_2Cl_2$) as precursors. Advantageously, the layer 103 is pseudomorphic, i.e. its thickness is less than its critical thickness for relaxation, from which it begins to undergo plastic relaxation.

The following steps in the process for fabricating the transistor 2 will be illustrated by sectional views through the nanowire 202 along a plane parallel to the substrate of the structure.

In the configuration illustrated in FIG. 21, the following steps are implemented:
conformal deposition of a protective layer 204 on top of the layer of SiGe 203. The protective layer 204 is typically made of $SiO_2$;
conformal deposition of a layer 205 of amorphous silicon on top of the protective layer 204;
conformal deposition of a hardmask layer 206 on top of the hardmask layer 205. The hardmask layer 206 is for example formed of SiN.

In the configuration illustrated in FIG. 22, a lithography step is carried out. Next, a step of anisotropically etching the layer 206 (to form the etch mask 216), the layer 205 and the layer 204 (and possibly etching the layer 203 instead of step illustrated with reference to FIG. 23) is carried out in order to form a sacrificial gate stack 210. The etch is stopped at the layer 203 in order to obtain the configuration illustrated in FIG. 22.

In the configuration illustrated in FIG. 23, a step of advantageously anisotropically etching the layer 203 following the pattern of the mask 216 is carried out in order to obtain the element 213 made of SiGe beneath the sacrificial gate stack 210. The etch is stopped at the nanowire 202 on either side of the gate stack in order to obtain the configuration illustrated in FIG. 23.

In the configuration illustrated in FIG. 24, spacers 220 are formed on either side of the sacrificial gate stack 210, of the hardmask 216 and of the element 213 made of SiGe. The formation of the spacers 220 may be implemented by deposition of SiN, then by etching this layer of SiN. The portions of the nanowire 202 on either side of the gate stack and of the spacers is typically etched until level with the nanowire 200.

In the configuration illustrated in FIG. 25, a source 231 and a drain 232 are formed on top of the nanowire 200, on either side of the assembly including the spacers 220 and the sacrificial gate stack 210. The source 231 and the drain 232 are typically formed by epitaxial deposition of a silicon alloy on top of the exposed portion of the nanowire 202. This silicon alloy may typically be doped appropriately.

In the configuration illustrated in FIG. 26, a protective layer 207 is formed on top of the source 231 and the drain 232, on either side of the assembly including the spacers 220 and the sacrificial gate stack 210.

In the configuration illustrated in FIG. 27, the hardmask 216 and the element 215 have been removed to form a groove 240 between the spacers 220. This removal operation is for example implemented by means of a selective-isotropic-etching operation that stops at the element 214. The element 214 then forms the bottom of the groove 240. It is also possible to envisage removing the element 214 and stopping the etch at the element 213.

In the configuration illustrated in FIG. 28, a step of condensation of germanium into the nanowire 202, via thermal oxidation of the element 203, is implemented in order to form a channel 252 made of SiGe in the nanowire 202. A thermal oxide 254 is also formed at the periphery of the channel 252 during the condensation process. Additionally, as illustrated in the configuration obtained in FIG. 28, the obtained channel 252 made of SiGe is aligned with the inner faces of the spacers 220. Moreover, because the element 213 is located to the side of the spacers 220 and not underneath them, the formation of a thermal oxide beneath the spacers 220 is avoided, which oxide would have to be removed with the formation of undesirable voids beneath these spacers 220.

In the configuration illustrated in FIG. 29, the process moves on to the removal of the thermal oxide 254 to expose the channel 252 at the bottom of the groove 240.

In the configuration illustrated in FIG. 30, the process moves on to forming a gate insulator 208 on the lateral faces and at the bottom of the groove 240. The gate insulator 208 could for example be $SiO_2$ or a material with a high dielectric constant such as HfOx.

In the configuration illustrated in FIG. 31, the process moves on to forming a gate electrode 233 in the groove 240 and over the gate insulator 208. The gate metal could for example be W, poly-Si.

The invention has been illustrated in the context of its application to a transistor formed on a silicon-on-insulator substrate. However, the invention is also applicable for a transistor formed on a bulk substrate.

The invention claimed is:

1. A process for fabricating a field-effect transistor, comprising:
    providing a structure including a first, silicon layer and a second layer, made of SiGe alloy, covering the first, silicon layer;
    forming a sacrificial gate covered with a hardmask on top of said second layer, made of SiGe alloy;
    etching the second layer, made of SiGe alloy, following the pattern of the hard mask until reaching the first, silicon layer in order to delimit an element made of SiGe alloy in the second layer, made of SiGe alloy;
    forming spacers on top of the first, silicon layer on either side of the sacrificial gate and of said element;
    removing the sacrificial gate;
    enriching the first layer arranged beneath said element in germanium using a process of germanium condensation by diffusion from the second layer, made of SiGe alloy, to the first layer.

2. The process according to claim 1, comprising a step of depositing a third layer made of silicon alloy, on top of the second layer, made of SiGe alloy.

3. The process according to claim 2, wherein the thickness of said deposited third layer is between 1 and 5 nm.

4. The process according to claim 1, wherein the formed sacrificial gate comprises a stack of a layer of $SiO_2$ and of a layer of amorphous silicon.

5. The process according to claim 4, wherein the removing the sacrificial gate comprises etching the layer of amorphous silicon with a stop at the layer of $SiO_2$.

6. The process according to claim 1, wherein said enriching step is implemented such that only some of the thickness of the first layer is enriched in germanium.

7. The process according to claim 1, wherein said first layer of the provided structure includes a nanowire, the second layer of the provided structure covering three faces of the nanowire.

8. The process according to claim 1, wherein the thickness of said second layer, made of SiGe alloy, is less than the critical thickness for plastic relaxation of the SiGe alloy.

9. The process according to claim 1, wherein the germanium concentration of the second layer, made of SiGe alloy, is between 10% and 40% in terms of number of atoms.

10. The process according to claim 1, wherein said provided structure includes a buried insulating layer formed beneath said first, silicon layer.

* * * * *